United States Patent
Fleckenstein et al.

(10) Patent No.: US 10,062,932 B2
(45) Date of Patent: Aug. 28, 2018

(54) METHOD AND DEVICE FOR DETERMINING THE INTERNAL TEMPERATURE OF AN ENERGY STORAGE DEVICE

(71) Applicant: Bayerische Motoren Werke Aktiengesellschaft, Munich (DE)

(72) Inventors: Matthias Fleckenstein, Isen (DE); Marcel Fenkart, Munich (DE); Oliver Bohlen, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 303 days.

(21) Appl. No.: 14/057,120

(22) Filed: Oct. 18, 2013

(65) Prior Publication Data
US 2014/0050951 A1 Feb. 20, 2014

(30) Foreign Application Priority Data
Apr. 21, 2011 (DE) .......... 10 2011 007 840

(51) Int. Cl.
| | | |
|---|---|---|
| *H01M 10/00* | (2006.01) | |
| *H01M 10/633* | (2014.01) | |
| *H01M 10/48* | (2006.01) | |
| *G06F 17/50* | (2006.01) | |

(52) U.S. Cl.
CPC .... *H01M 10/5022* (2013.01); *G06F 17/5009* (2013.01); *H01M 10/482* (2013.01); *H01M 10/486* (2013.01)

(58) Field of Classification Search
CPC ............ H01M 10/486; H01M 10/443; H01M 8/0432; H01M 10/5022; H01M 10/633; H01M 10/482
See application file for complete search history.

(56) References Cited

U.S. PATENT DOCUMENTS

| | | |
|---|---|---|
| 4,897,322 A | 1/1990 | Jessen |
| 5,711,605 A * | 1/1998 | Reher et al. .......... 374/141 |
| 6,076,964 A | 6/2000 | Wu et al. |
| 2012/0109554 A1* | 5/2012 | Lin et al. .......... 702/63 |

FOREIGN PATENT DOCUMENTS

| | | | |
|---|---|---|---|
| DE | 10 2007 049 707 A1 | 4/2009 | |
| DE | 10 2009 037 088 A1 | 2/2011 | |
| DE | 102009037088 A1 * | 2/2011 | .......... H01M 10/486 |
| EP | 0 310 982 A2 | 4/1989 | |

(Continued)

OTHER PUBLICATIONS

English Translation of DE102009037088: eSN_DE102009037088.pdf (Feb. 2011) English Translation of EP2071344: eSN_EP2071344.pdf (Jun. 2009).*

(Continued)

*Primary Examiner* — Nicholas P D'Aniello
(74) *Attorney, Agent, or Firm* — Crowell & Moring LLP

(57) ABSTRACT

A method is provided for determining the internal temperature of an electrochemical energy storage device, particularly for a motor vehicle. The internal temperature of a cell winding of the energy storage device is determined by calculation in a control device of the energy storage device by way of a thermal model for the energy storage device which is saved in the control device.

16 Claims, 3 Drawing Sheets

(56) References Cited

FOREIGN PATENT DOCUMENTS

| EP | 1 212 630 B1 | 2/2009 | | |
|---|---|---|---|---|
| EP | 2071344 A1 | * | 6/2009 | .......... H01M 10/486 |
| WO | WO 97/34133 A1 | | 9/1997 | |
| WO | WO 98/22830 A2 | | 5/1998 | |
| WO | WO 9822830 A2 | * | 5/1998 | ............. G01R 31/36 |

OTHER PUBLICATIONS

Corresponding International Search Report with English Translation dated Jun. 14, 2012 (six (6) pages).
German Search Report with English Translation dated Oct. 27, 2011 (ten (10) pages).
International Preliminary Report on Patentability (PCT/IB/326 & PCT/IB/373) and Written Opinion (PCT/ISA/237) dated Oct. 31, 2013 (nine (9) pages).
Chinese Office Action issued in Chinese counterpart application No. 201280019352.0 dated Dec. 31, 2015, with partial English translation (Seven (7) pages).

* cited by examiner

METHOD AND DEVICE FOR DETERMINING THE INTERNAL TEMPERATURE OF AN ENERGY STORAGE DEVICE

CROSS-REFERENCE TO RELATED APPLICATIONS

This application is a continuation of PCT International Application No. PCT/EP2012/056405, filed Apr. 10, 2012, which claims priority under 35 U.S.C. § 119 from German Patent Application No. DE 10 2011 007 840.1, filed Apr. 21, 2011, the entire disclosures of which are expressly incorporated by reference herein.

BACKGROUND AND SUMMARY OF THE INVENTION

The invention relates to a method and a device for determining the internal temperature of an electrochemical energy storage device, particularly for a motor vehicle.

The energy of an electrochemical energy storage device depends on its operating temperature. This is particularly true for—but not only for—energy storage devices which use lithium ion storage cells.

An energy storage device used in the motor vehicle field typically has a plurality of storage cells which are electrically connected to each other in series and/or in parallel in order to be able to provide a prespecified output voltage and a prespecified output current. In the storage modules developed to date, the storage cells are based on the lithium ion technology mentioned above. These are ideally operated in a defined temperature range. This can be defined, by way of example, between the temperatures of +5° C. and +40° C. If the operating temperature of the storage cells exceeds the upper temperature threshold, accelerated aging results, such that it is frequently not possible to comply with a required operating life. If, in contrast, the storage cells are operated below the lower temperature threshold, the capacity of the cells is sharply reduced. In addition, it is not possible to operate the storage cells efficiently in this temperature range. When energy storage devices are used in the field of motor vehicles, the temperature thereof is regulated for this reason.

In order to make it possible to regulate the temperature of storage cells precisely and efficiently, it is necessary to have the most precise possible knowledge of the actual temperature—meaning the internal temperature of the storage cells. It is then possible to carry out the cooling or heating of the storage cells on the basis of the determined current temperature of the storage cells. The detection of the temperature of the energy storage device is most commonly realized via a temperature sensor on the surface of the housing of the energy storage device or on a single storage cell. The temperature value measured at this location does not, however, correspond to the actual internal temperature of the electrochemical energy storage device. For this, a direct measurement of the internal temperature of a cell chamber would be necessary. However, a measurement of the internal temperature of a storage cell involves a great deal of constructive complexity. First, the process for manufacturing the energy storage device would be more involved, for example due to the routing of cable for the temperature sensor. Secondly, additional measures would need to be taken in order to meet the demands for tight sealing of the affected storage cell and/or of the energy storage device as a whole.

The problem addressed by the present invention is that of providing a method and a device by which it is possible to determine the internal temperature of an electrochemical energy storage device in a simpler manner.

These problems are addressed by providing a method, according to the invention, for the determination of the internal temperature of an electrochemical energy storage device, particularly for a motor vehicle, wherein the internal temperature of a cell winding of the electrochemical energy storage device is determined by a computer in a control device of the energy storage device. The computer utilizes a thermal model for the electrochemical energy storage device, said model being saved in the control device.

The invention also creates an electrochemical energy storage device, particularly for a motor vehicle, having a control device, wherein a thermal model of the electrochemical energy storage device is saved in the control device, and wherein the energy storage device is designed to execute the method according to the invention.

By way of the invention, it is possible to dispense with a temperature sensor used for the direct measurement of the internal temperature of the electrochemical energy storage device, which results in a benefit for the constructive embodiment of the energy storage device. By simulating the internal temperature using a thermal model for the energy storage device, it is possible, on the one hand, to realize the most precise possible temperature regulation of the storage cells of the energy storage device. A more homogeneous and warmer operation of the energy storage device over time, as a result of a precise temperature regulation, leads to a more efficient operation of the energy storage device overall, without posing the risk of damage to the storage cells of the energy storage device. Likewise, the risk of such temperature thresholds of storage cells of the energy storage device being exceeded is minimized, wherein the same leads to a more rapid aging. A further advantage of simulating the internal temperature of the energy storage device is that a more precise temperature signal can be used as the input signal for additional aspects of a status recognition function, such as a charge state recognition, by way of example. As a result, the precision of further status estimations is also increased.

The thermal model of the energy storage device is advantageously established on the basis of the thermal capacities and the thermal resistances. In this case, a thermal resistor is disposed between two of the thermal capacitances. The thermal capacitances represent components of the energy storage device, such as the cell winding of one or multiple storage cells, the housing of a storage cell, a connector terminal of the storage cell, a cooling device, etc., by way of example. By use of the thermal resistance between two of the thermal capacitances, a measure for the heat conductance from one thermal capacitance to the other thermal capacitance is taken into account.

In particular, the thermal model takes into account the thermal capacitances for the cell winding of at least one storage cell of the energy storage device, for the housing of the storage cell(s), for at least one connector terminal of the storage cell(s), and optionally for the cooling device. The incorporation of the cooling device as a thermal capacitance in the thermal model is optional because the cooling device can be switched on or off according to the regulation. If the cooling device is not active, then it can be left out of the thermal model. Only if the cooling device is in operation is it necessary to take into account the thermal capacity thereof.

It is also advantageous if a thermal dissipation loss of the energy storage device is worked into the thermal model. The thermal dissipation loss is determined by measurement from a detected current in the energy storage device, by way of example. The incorporation of the thermal dissipation loss of the energy storage device is significant if the temperature of the cell winding of one of the storage cells is determined as part of the simulation of temperature, because this is influenced by the thermal dissipation loss.

It is also advantageous if at least the temperature of one component of the energy storage device which represents one of the thermal capacitances excluding the cell winding is determined by measurement and is incorporated into the thermal model. A temperature which is simple to measure is preferably included—for example the temperature on the outside of the housing. As an alternative, the temperature at a connector terminal can be detected by means of measurement—as can the temperature of the cooling device.

For the thermal model, heat volumes exchanged between two adjacent thermal capacitances are determined iteratively for a prespecified time interval from the temperature difference between the two thermal capacitances, using the following formula:

$$Q_{i \to i+1} = \frac{T_i - T_{i+1}}{R_{th, i \to i+1}} \Delta t \tag{1}$$

Next, for the thermal model, the temperatures for the thermal capacitances for each prespecified time interval are determined iteratively from the determined heat volume, using the following formula:

$$T_i(t_0 + \Delta t) = T_i(t_0) + \frac{1}{C_{th,i}} \sum_{k=1}^{n} Q_k \tag{2}$$

The method according to the invention is therefore based on the iterative determination of heat flows for each thermal capacitance, wherein the corresponding temperatures can then be calculated therefrom. Because the method according to the invention is determined "online"—meaning in real-time during the operation of the control device of the energy storage device, it is necessary to make an initial determination of the starting values of at least some of the temperatures, said starting values being used in the simulation, when the control device is re-started. In this process, a differentiation must be made as to whether the restart of the control device takes place within a prespecified threshold for the downtime phase, or if the restart takes place after the prespecified threshold for the downtime phase has been exceeded. In the latter case, it can be assumed that all of the components of the energy storage device have the same temperature value. As such, the at least one temperature value of the control device, the same determined by making a measurement after the start of the control device, can also be used for the temperature values of the other components. As an alternative, the initial condition can be calculated as a continuous function of the downtime phase—for example in the form of a decay curve.

If the prespecified value for the downtime phase has not yet been reached upon the restart of the control device, and therefore the restart of the energy storage device, then the components of the energy storage device have different temperature values. In this case, it is advantageous if, after a period of downtime of the energy storage device, and up to a prespecified maximum time, starting temperature values for the temperatures of the components, said temperatures representing the thermal capacitances and also being impossible to detect by measurement, or being not detected by measurement, are estimated by a computer for use in the thermal model. In this way, it is possible to minimize a starting-value error in the determined temperature following every downtime phase.

The minimization of the offset error in this case can be estimated mathematically prior to the simulation carried out in real-time. In a first variant, the following steps can be carried out for the estimation of a starting temperature value following the downtime phase. First, the relevant temperature values last determined by a computer before the downtime phase are saved, along with one measured temperature value at another component of the storage cells. At the end of the downtime phase, a temperature difference between the saved, measured temperature value and the temperature value determined by a computer is calculated, wherein the temperature value determined by a computer is corrected before the subtraction, by means of a prespecified decay curve and the duration of the downtime phase. The temperature difference is added to the temperature value measured at the end of the downtime phase, wherein the resulting sum gives the current temperature value.

In addition, for the fastest possible correction of the residual starting-value error in the starting phase of each simulation, and also for the purpose of minimizing the difference between the simulation and reality, a regulatory observer can be implemented during the entire period of the simulation. By means of the regulatory observer, a measured surface temperature can advantageously be incorporated in the thermal model at the same time. By way of example, this can be carried out for the current-tap terminal at a given cooling device temperature.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
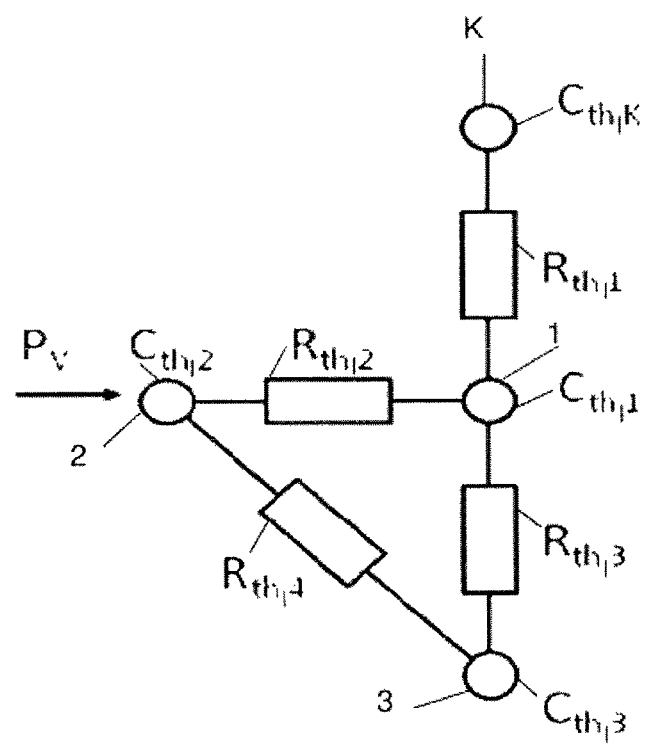
FIG. 1 shows an equivalent thermal circuit diagram of a simplified electrochemical energy storage device, particularly for use in a motor vehicle.

FIG. 1 shows an equivalent thermal circuit diagram for an electrochemical energy storage device, as can be used in an electric motor vehicle, by way of example. Such an energy storage device has, by way of example, a plurality of prismatic storage cells arranged one behind the other. In principle the electrochemical energy storage devices could also be formed by a plurality of cylindrical storage cells. Each of the storage cells has two connector terminals. The first connector terminal is the positive pole, by way of example, and the second connector terminal is the negative pole of the storage cell. The positive pole is typically electrically connected to the housing of the storage cells. The storage cells are arranged one behind the other in such a manner that the connector terminal of one storage cell is in a position adjacent to a second connection terminal of the neighboring storage cell. Because of the fact that two connection terminals arranged adjacent to each other are arranged next to each other, a series connection of the storage cells can be made using connector elements. It is also possible that two identical connector terminals which are arranged adjacent to each other are arranged next to each other in order to connect neighboring storage cells in parallel. In this way, it is possible for the energy storage device to provide higher currents.

All of the storage cells together are typically arranged in a housing. A cooling and heating device is typically arranged at the base of the housing, and can be integrated into the housing, in order to keep the storage cells in a prescribed temperature range during operation of the energy storage device.

At present, storage cells of an energy storage device for use in a motor vehicle are typically based on lithium ion technology. Such storage cells must be operated in a defined temperature range. This can be defined as between +5° C. and +40° C., for example. Temperatures above +40° C. can lead to a reduced operating life of the cells. Operation at temperatures below +5° C. leads to reduced performance and lower efficiency of each storage cell during operation. These problems also arise—potentially with different temperature boundaries—for other types of storage cells as well. The more precisely the actual temperature in the interior of each storage cell is determined, the more precisely the storage cells of the energy storage device can be cooled and/or heated.

According to the invention, instead of an actual measurement, the internal temperature of the energy storage device is determined by a computer via simulation using a thermal model saved in a control device of the energy storage device. In the present description, the "internal temperature" means the temperature occurring in the interior of a storage cell, said temperature corresponding to that of the so-called cell winding in which the electrochemical processes of the storage cell take place.

For this purpose, a thermal model of the energy storage device is used which includes the thermal capacitances $C_{th,i}$—wherein i=1 to k—and the thermal resistances $R_{th,j}$—wherein j=1 to 4. The simplified thermal model illustrated in FIG. 1 incorporates the thermal capacitances $C_{th,1}$, $C_{th,2}$, $C_{th,3}$, and $C_{th,k}$ for the housing 1 of an energy storage cell, the cell winding 2 of one of the storage cells of the energy storage device, a cell and/or connector terminal 3 of an energy storage device, and an optional cooling device K. According to the possible heat conductance paths in the energy storage device, the thermal resistances $R_{th,1}$, $R_{th,2}$, $R_{th,3}$, and $R_{th,4}$ are disposed between every pair of the thermal capacitances. The resistance $R_{th,1}$ represents the thermal resistance between the cooling device K and the housing 1. $R_{th,2}$ represents the thermal resistance between the housing 1 and the cell winding 2. $R_{th,3}$ represents the thermal resistance between the housing 1 and the cell terminal 3. $R_{th,4}$ represents the thermal resistance between the cell winding 2 and the cell- and/or connector terminal 3. During operation of the energy storage device, the temperatures T1, T2, T3, and Tk arise at the components 1, 2, 3, K which represent the thermal capacitances.

The thermal capacitance $C_{th,k}$ of the cooling device K, and the associated thermal resistance $R_{th,1}$ can be taken into account according to whether the cooling device K is being operated or not. If the cooling device is not being actively used for temperature regulation of the energy storage device, the named components can be left out. Only if the cooling device is activated is it sensible to take into account the named components.

In addition, a thermal dissipation loss PV of the energy storage device is taken into account by the thermal model. This can be determined, by way of example, indirectly from a current in the energy storage device, said current being detected by measurement.

For the purpose of simulating the internal temperature of the energy storage device, it is advantageous if at least one of the temperatures T1, T3, Tk of the housing 1, of the cell- and/or connector terminal 3, or of the cooling device K is determined. In this way, it is possible to correctly determine the internal temperature of the energy storage device in a short time. However, in principle, such a provision of a temperature signal by means of measurement can be dispensed with. In any case, the correct determination of the internal temperature of the energy storage device would require much more time as a result.

The internal temperature of the energy storage device is determined "online"—meaning in real-time—by calculation in the control device assigned to the energy storage device. For this purpose, the heat volume Q exchanged between two neighboring thermal capacitances $C_{th,i}$ and $C_{th,i+1}$ is determined iteratively for each time interval $\Delta t$, from the temperature difference Ti−Ti+1. Because the heat flow Q/Δt from one thermal capacitance i to another thermal capacitance i+1 can be assumed to be constant during a time interval, the exchanged heat volume during the time interval according to equation (1) is determined as $$Q_{i \to i+1} = \frac{T_i - T_{i+1}}{R_{th, i \to i+1}} \Delta t. \qquad (1)$$

The temperature at the thermal capacitance $C_{th,i}$ can then be determined explicitly for each time interval using the heat flow balance according to equation (2):

$$T_i(t_0 + \Delta t) = T_i(t_0) + \frac{1}{C_{th,i}} \sum_{k=1}^{n} Q_k \qquad (2)$$

In other words, this means that for each of the components 1, 2, 3, K represented by a thermal capacitance, a heat volume balance arises, wherein the heat volume produced by the thermal capacitance and the heat volume flowing into the associated thermal capacitance are added together. The heat volumes can be determined using the temperature differences at the thermal capacitances which are adjacent in each case. Although only the internal temperature of the cells of the energy storage device is of interest for the regulation of a cooling and/or heating function of the energy storage device, the temperatures of neighboring thermal capacitances are also required to determine this temperature, such that these are determined by means of simulation, and/or detected by means of measurement, as desired.

In order to keep a starting-value error in the temperature(s) of the components, following each downtime phase of the energy storage device, said temperature(s) being determined by calculation, as minimal as possible, the starting temperature value used in the simulation must be estimated mathematically prior to the iterative simulation being carried out. This is particularly important if the duration of the downtime is less than a prespecified threshold value which depends on the type and the geometry of the energy storage device. The threshold value for the downtime phase is approximately between 1 and 3 hours for prismatic storage cells, according to the cell size. If the energy storage device has cylindrical storage cells, then the threshold value for the downtime phase is between 0.5 and 2 hours according to the cell size. The mathematical estimation of the starting temperature value only takes place if the downtime phase is less than the threshold value prespecified for the energy storage device. If the downtime phase exceeds the threshold value, it can be assumed that the temperatures at the relevant components have balanced out to one value. As such, the temperature value determined by a measurement—for example that of cell terminal 3—can be used as the starting value.

Figure 2:
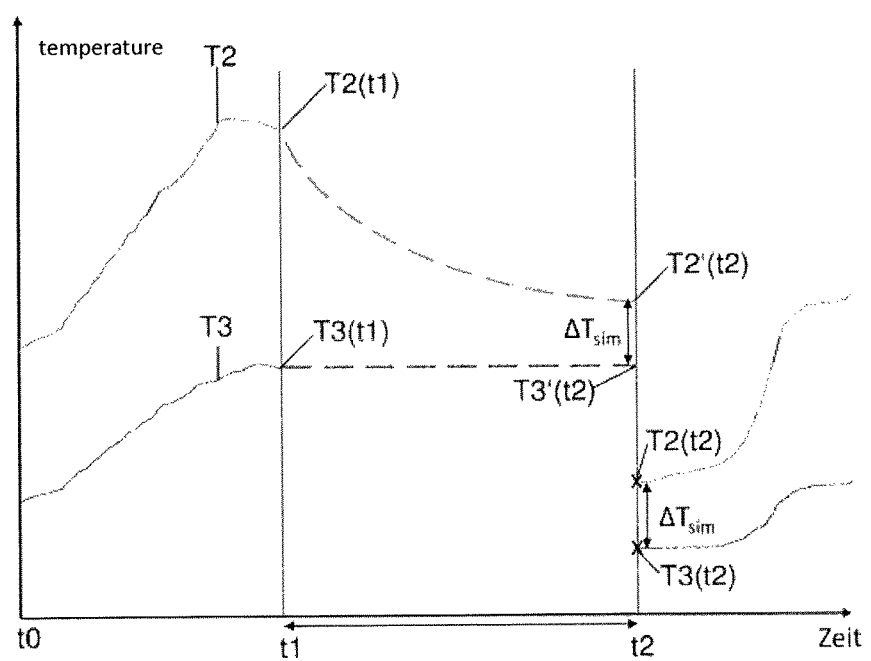
FIG. 2 shows a temperature-time diagram which explains the process for determining starting values for the simulation for temperature components which are not detected by measurement, following a downtime phase.

If, in contrast, the downtime phase is less than the prespecified threshold value, an estimation of the starting temperature value is carried out as described below. The principle in this case is illustrated schematically in FIG. 2. FIG. 2 shows a temperature-time diagram, with the temperature profiles for the cell winding (T2) and the cell- and/or connector terminal (T3) over time. Between t0 and t1, the energy storage device is in operation and the temperature value T3 is measured, and the temperature value T2 of the cell winding is simulated via the thermal model. At time point t1, a downtime phase (standing phase) begins—meaning that no energy is removed from the energy storage device, and no energy is fed into the energy storage device. The downtime phase lasts until time point t2. For the purpose of minimizing a starting-value error of the temperature determined in the simulation, first—at the beginning of the downtime phase, meaning at time point t1—the measured temperature value T3 (t1) and the computer-determined temperature value T2 (t1) are saved in the control device. At the end of the downtime phase—meaning at time point t2—the energy storage device is brought into operation once more.

In this process, the duration of the downtime phase—meaning t2–t1—is first determined by the control device. A temperature difference ΔTsim with respect to the reference temperature T3 (t1) can be determined by use of decay curves saved in the control device for the cell winding T2. The decay curve is, in very close approximation, an exponential function with a customized time constant. The internal temperature of the cell winding T2' (t2) can be calculated at time point t2 from the decay curve and the length of the downtime phase. The difference from the saved temperature of the cell terminal T3' (t2) gives the desired temperature difference ΔTsim. In this case, it is assumed that T3' (t2) corresponds to the saved temperature T3 (t1) at time point t1. The calculated temperature difference ΔTsim is then added to the first measured value at cell terminal T3 (t2). The starting temperature value T2 (t2) at time point t2 is found as a result.

Figure 3:
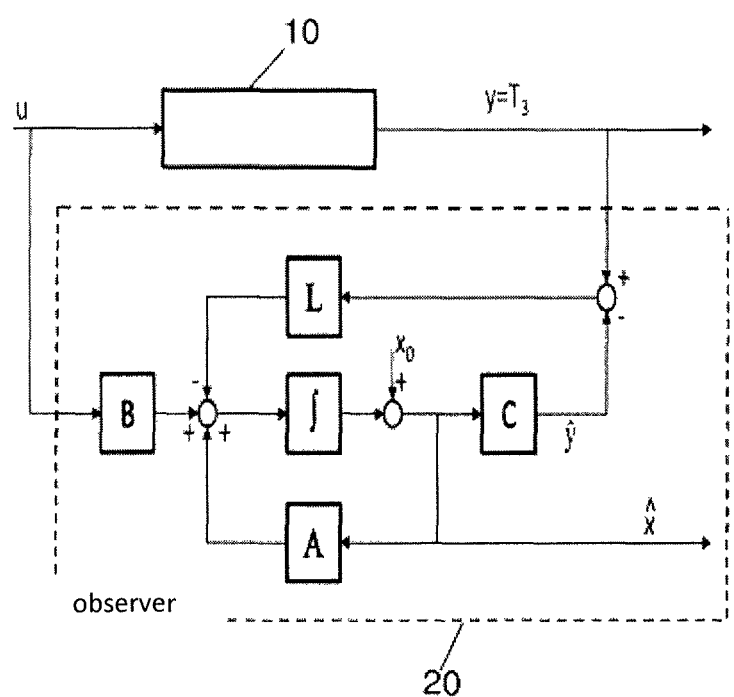
FIG. 3 shows a schematic illustration of a regulatory observer for the purpose of minimizing errors in the thermal model of the energy storage device according to FIG. 1.

In order to also carry out the fastest possible correction of the residual starting-value error following the downtime phase, and also to minimize the deviation between the simulation and reality during the entire period of the simulation, a regulatory observer can be used. Such a regulatory observer 20 is illustrated in FIG. 3 in connection with an energy storage device 10. The regulatory observer 20 is designed as a Luenberger observer, which is known in the prior art. When an observer is used for the purpose of minimizing a starting-value or offset error, it is possible to simultaneously incorporate the measured temperature—for example at the cell terminal—into the observer model. As a result, the simulation can be adjusted to the measured value.

The description of the thermal model using differential equations according to equations (1) and (2) can be transferred to the state space. The last term of the right side of equation (3) and (4) reflects the feedback of the temperature measurement signal from the cell terminal in the simulation.

$$\dot{x} = A \cdot x + B \cdot u + L(y - \hat{y}) \quad (3)$$

$$\begin{pmatrix} \dot{T}_1 \\ \dot{T}_2 \\ \dot{T}_3 \end{pmatrix} = \begin{pmatrix} -\frac{1}{C_1 R_1} - \frac{1}{C_1 R_2} - \frac{1}{C_1 R_3} & \frac{1}{C_1 R_2} & \frac{1}{C_1 R_3} \\ \frac{1}{C_2 R_2} & -\frac{1}{C_2 R_2} - \frac{1}{C_2 R_4} & \frac{1}{C_2 R_4} \\ \frac{1}{C_3 R_3} & \frac{1}{C_3 R_4} & -\frac{1}{C_3 R_3} - \frac{1}{C_3 R_4} \end{pmatrix} \cdot \begin{pmatrix} T_1 \\ T_2 \\ T_3 \end{pmatrix} + \begin{pmatrix} 0 & \frac{1}{C_1 R_1} \\ \frac{1}{C_2} & 0 \\ 0 & 0 \end{pmatrix} \cdot \begin{pmatrix} P_V \\ T_K \end{pmatrix} + \begin{pmatrix} l_1 \\ l_2 \\ l_3 \end{pmatrix} \cdot (y - \hat{y}) \quad (4)$$

$$y = C \cdot x \quad (5)$$

$$y = (0 \ 0 \ 1) \cdot \begin{pmatrix} T_1 \\ T_2 \\ T_3 \end{pmatrix} \quad (6)$$

Equations (3), (4), (5) and (6) represent the state space illustration of the thermal model in combination with a Luenberger observer according to FIG. 3, in a manner known to a person skilled in the art. The thermal model is therefore concurrently simulated in the control device.

Deviations between the simulation and the measured temperature values can be multiplied by a correction matrix L and fed back into the thermal model. As a result, the observer 20 can react to imprecisions in the model and in the determination of the starting value. The starting temperature value is fed into the observer at $x_o$.

LIST OF REFERENCE NUMBERS

1 housing
2 cell terminal
3 cell winding
K cooling device
10 energy storage device
20 observer
T1 temperature of the housing
T2 temperature of the cell terminal
T3 temperature of the cell winding
TK temperature of the cooling device
T2(t1) temperature of the cell terminal at time point t1
T3(t1) temperature of the cell winding at time point t1
T2'(t2) temperature of the cell terminal at time point t2, saved at time point t1
T3'(t2) calculated temperature of the cell winding at time point t2

T2(t2) starting temperature value of the cell terminal at time point t2
T3(t2) measured temperature of the cell winding at time point t2
PV thermal dissipation loss
$C_{th,1}$ thermal capacitance of the housing
$C_{th,2}$ thermal capacitance of the cell terminal
$C_{th,3}$ thermal capacitance of the cell winding
$C_{th,K}$ thermal capacitance of the cooling device
$R_{th,1}$ thermal resistance of the housing
$R_{th,2}$ thermal capacitance of the cell terminal
$R_{th,3}$ thermal capacitance of the cell winding
$R_{th,K}$ thermal capacitance of the cooling device
T temperature
t time The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for determining and regulating an internal temperature of an electrochemical energy storage device, the method comprising the acts of:
    storing a thermal model for the electrochemical energy storage device in a control device of the electrochemical energy storage device; and
    determining, via a computer in the control device of the electrochemical energy storage device, a heat volume exchanged between adjacent thermal capacitances that is determined iteratively from a temperature difference between said adjacent thermal capacitances, in real-time during operation of the control device and over a plurality of prespecified time interval,
    determining, by the control device, an internal temperature of a cell winding of the electrochemical energy storage device on an iterative basis over the plurality of prespecified time intervals using the thermal model saved in the control device and the determined heat volume exchanges for corresponding ones of the plurality of prespecified time intervals; and
    regulating, by the control device, at least one of a cooling and heating function of the energy storage device based on at least one of the determined internal temperatures of the cell winding,
    wherein adjacent thermal capacitances represent at least distinct thermal capacitances of respective adjacent electrochemical energy storage device components.

2. The method according to claim 1, wherein the thermal model of the energy storage device is formed from thermal capacitances and temperature sensors, wherein a thermal resistance is disposed between two of the thermal capacitances.

3. The method according to claim 2, wherein the thermal capacitances for the cell winding of at least one storage cell of the energy storage device, for a housing of the storage cell, and for at least one connector terminal of the storage cell are taken into account in the thermal model.

4. The method according to claim 3, further wherein the thermal capacitance for a cooling device of the electrochemical energy storage device is taken into account in the thermal model.

5. The method according to claim 1, wherein a thermal dissipation loss of the energy storage device is processed in the thermal model, said thermal dissipation loss being determined from a current in the energy storage device which is detected by measurement.

6. The method according to claim 3, wherein a thermal dissipation loss of the energy storage device is processed in the thermal model, said thermal dissipation loss being determined from a current in the energy storage device which is detected by measurement.

7. The method according to claim 1, wherein at least a temperature of one component of the energy storage device, said component representing one of the thermal capacitances with the exception of that of the cell winding, is determined by measurement and is taken into account in the thermal model.

8. The method according to claim 6, wherein at least a temperature of one component of the energy storage device, said component representing one of the thermal capacitances with the exception of that of the cell winding, is determined by measurement and is taken into account in the thermal model.

9. The method according to claim 1, wherein said heat volume exchanged between two adjacent thermal capacitances is determined iteratively according to the following formula:

$$Q_{i \to i+1} = \frac{T_i - T_{i+1}}{R_{th, i \to i+1}} \Delta t$$

where,
$Q_{i \to i+1}$ = heat volume exchanged between adjacent thermal capacitances,
$T_i$ = temperature of the storage device component representing one of the adjacent thermal capacitances,
$T_{i+1}$ = temperature of the storage device component representing another of the adjacent thermal capacitances,
$R_{th, i \to i+1}$ = thermal resistance between the adjacent thermal capacitances, and
$\Delta t$ = the prespecified time interval.

10. The method according to claim 8, wherein said heat volume exchanged between two adjacent thermal capacitances is determined iteratively according to the following formula:

$$Q_{i \to i+1} = \frac{T_i - T_{i+1}}{R_{th, i \to i+1}} \Delta t$$

where,
$Q_{i \to i+1}$ = heat volume exchanged between adjacent thermal capacitances,
$T_i$ = temperature of the storage device component representing one of the adjacent thermal capacitances,
$T_{i+1}$ = temperature of the storage device component representing another of the adjacent thermal capacitances,
$R_{th, i \to i+1}$ = thermal resistance between the adjacent thermal capacitances, and
$\Delta t$ = the prespecified time interval.

11. The method according to claim 10, wherein the temperatures for the thermal capacitances for each prespecified time interval are determined iteratively for the thermal model from the determined, exchanged heat volumes, according to the following formula:

$$T_i(t_0 + \Delta t) = T_i(t_0) + \frac{1}{C_{th,i}} \sum_{k=1}^{n} Q_k$$

where, $Q_k$=heat volume for storage device component k,
$T_i$=temperature of the storage device component representing one of the adjacent thermal capacitances,
$C_{th,i}$=one of the adjacent thermal capacitances,
$t_0$=an initial time, and
$\Delta t$=the prespecified time interval.

12. The method according to claim 3, wherein, following a downtime phase, and up to a prespecified maximum time period of the energy storage device, starting temperature values are estimated by calculation for the temperatures of components which represent the thermal capacitances, for use in the thermal model, wherein said temperatures cannot be detected by measurement or are not detected by measurement.

13. The method according to claim 11, wherein, following a downtime phase, and up to a prespecified maximum time period of the energy storage device, starting temperature values are estimated by calculation for the temperatures of components which represent the thermal capacitances, for use in the thermal model, wherein said temperatures cannot be detected by measurement or are not detected by measurement.

14. The method according to claim 12, wherein, for estimation of the starting temperature value following the downtime phase:

a relevant temperature value last determined by calculation prior to the downtime phase, as well as a measured temperature value, are saved;

at the end of the downtime phase, a temperature difference between the saved, measured temperature value and the temperature value determined by calculation is calculated, and the temperature value determined by calculation is corrected prior to the temperature subtraction being performed, by use of a prespecified decay curve and the duration of the downtime phase; and a temperature difference is added to the temperature value measured at the end of the downtime phase, wherein the resulting sum gives the starting temperature value.

15. The method according to claim 12, wherein a regulatory observer is implemented in the simulation for the purpose of correcting the starting temperature value following the downtime phase.

16. The method according to claim 14, wherein a regulatory observer is implemented in the simulation for the purpose of correcting the starting temperature value following the downtime phase.

* * * * *